United States Patent
Wolf et al.

(10) Patent No.: US 7,936,291 B2
(45) Date of Patent: May 3, 2011

(54) SYSTEM AND METHOD FOR REMOVING NONLINEARITIES AND CANCELLING OFFSET ERRORS IN COMPARATOR BASED/ZERO CROSSING BASED SWITCHED CAPACITOR CIRCUITS

(75) Inventors: Robert Wolf, Dresden (DE); Christoph Lang, Cupertino, CA (US); Xinyu Xing, San Jose, CA (US); Sam Kavusi, Menlo Park, CA (US); Chinwuba Ezekwe, Albany, CA (US)

(73) Assignee: Robert Bosch GmbH, Stuttgart (DE)

( * ) Notice: Subject to any disclaimer, the term of this patent is extended or adjusted under 35 U.S.C. 154(b) by 180 days.

(21) Appl. No.: 12/249,746

(22) Filed: Oct. 10, 2008

(65) Prior Publication Data

US 2010/0090724 A1   Apr. 15, 2010

(51) Int. Cl.
*H03M 1/06* (2006.01)
(52) U.S. Cl. .......................................... 341/118; 341/120
(58) Field of Classification Search .................. 341/118; 327/50, 94; 333/173; 307/359; 375/76
See application file for complete search history.

(56) References Cited

U.S. PATENT DOCUMENTS

| 4,996,529 | A | 2/1991 | Connell |
| 5,739,720 | A | 4/1998 | Lee |
| 5,818,374 | A * | 10/1998 | Tan ................................ 341/143 |
| 6,683,514 | B2 | 1/2004 | Fujimoto |
| 6,931,124 | B1 * | 8/2005 | Rubacha et al. ............... 379/421 |
| 7,474,163 | B1 * | 1/2009 | Wile et al. ...................... 331/143 |
| 7,616,145 | B2 * | 11/2009 | Lee ................................ 341/155 |
| 2007/0222483 | A1 | 9/2007 | Lee |

* cited by examiner

*Primary Examiner* — Rexford N Barnie
*Assistant Examiner* — Joseph Lauture
(74) *Attorney, Agent, or Firm* — Maginot, Moore & Beck

(57) ABSTRACT

A method compensates for errors in an output signal of a comparator based/zero crossing based circuit. The method includes generating with a comparator based/zero crossing based switched capacitor circuit a first output signal with an input signal, generating with the comparator based/zero crossing based switched capacitor circuit a second output signal with the input signal of an opposite polarity, and subtracting the second output signal from the first output signal to generate a final output signal for the comparator based/zero crossing based switched capacitor circuit.

20 Claims, 6 Drawing Sheets

SYSTEM AND METHOD FOR REMOVING NONLINEARITIES AND CANCELLING OFFSET ERRORS IN COMPARATOR BASED/ZERO CROSSING BASED SWITCHED CAPACITOR CIRCUITS

TECHNICAL FIELD

This disclosure relates generally to low power switched capacitor circuits and, more particularly, to low power switched capacitor circuits having comparator based/zero crossing based designs.

BACKGROUND

Switched capacitor circuits are frequently used in low power applications, such as analog/digital (A/D) converters and filter applications, for example. These circuits operate in discrete time and typically include several stages. Each stage frequently includes an operational amplifier or an operational transconductance amplifier. These components consume energy during the whole duty cycle and the settling time for the output voltage can be quite long as the output signal settles exponentially with time.

A conventional switched capacitor sampling stage is shown in FIG. 8 and a switched capacitor gain stage is shown in FIG. 9. The offset on the input stage is shown in the graph of the input signal in FIG. 10. The output of the gain stage 500 may be expressed as Vin×Cin/Cfb. The settling time for this output signal is shown in the graph of FIG. 11. If fourteen bits of accuracy are required for the output, then ten time constants are required for the output to settle sufficiently. During the time that the output voltage is settling, the stage is using power to generate the output voltage. Increasing power can result in an increase in speed for generating the output for the circuit; however, this action causes the circuit to consume more power.

To address the issues arising from switched capacitor circuits, comparator based/zero crossing based switched capacitor circuits were designed and implemented. The sampling stage of these circuits is generally the same as the one shown for the switched capacitor circuit in FIG. 8. In the gain stages for these types of circuits, an example of which is shown in FIG. 12, the operational amplifier or operational transconductance amplifier is replaced with a comparator 604 and a controlled current source 608. In response to the comparator detecting a virtual ground condition at its inputs, the comparator switches off the controlled current source so the current source no longer drains current. Because the current source is turned on for only a relatively short period of time, these circuits reduce overall energy consumption. Additionally, the current source ramps the output voltage linearly, which yields a faster settling time and shorter duty cycle. Moreover, comparators are simpler than operational amplifiers or operational transconductance amplifiers, and therefore, can typically be implemented using less area.

The input signal and output signal for a comparator based/zero crossing based circuit are shown in FIG. 13 and FIG. 14, respectively. While the linear forms for these signals provide faster response times, the overshoot in these signals result in a positive offset. This overshoot produces both an offset error and a linearity error in the signals. These errors are influenced by certain parameters of the circuit, such as comparator delay and the non-linear response of some components in the circuit, such as switches. To address the offset error, some efforts have been made to use a second controlled current source with a much smaller value for fine adjustment.

SUMMARY

To address the issues arising from comparator based/zero crossing based switched capacitor circuits, a correlated double sampled input has been developed for such a circuit. One circuit includes a sampling stage configured to store an input signal with opposite polarities, a pair of input switches, each input switch having an input coupled to the sampling stage, a comparator having a first input coupled to an output from each input switch in the pair of switches, a controlled current source having a control input that is coupled to an output of the comparator, a feedback capacitor that is coupled between an output of the controlled current source and the input of the comparator, a pair of output switches, each output switch having an input coupled to the output of the controlled current source, a pair of output capacitors, each input of the output capacitors being coupled to an output of one of the output switches and each output of the output capacitors being coupled to a second input of the comparator, and a controller to generate control signals to the input switches and the output switches, the controller being configured to generate signals to couple selectively the input switches to the input of the comparator in synchronization with the output switches being selectively coupled to the output capacitors to enable the comparator based/zero crossing based circuit to generate two output signals, one of which is stored in one output capacitor and the other is stored in the other output capacitor.

The controller may also be configured to couple the two output capacitors together to subtract one output signal from the other output signal to cancel errors in the two output signals from one other.

A method compensates for errors in a comparator based circuit. The method includes generating with a comparator based/zero crossing based switched capacitor circuit a first output signal with an input signal, generating with the comparator based/zero crossing based switched capacitor circuit a second output signal with the input signal of an opposite polarity, and subtracting the second output signal from the first output signal to generate a final output signal for the comparator based/zero crossing based switched capacitor circuit.

Another method also compensates for offset error in a comparator based/zero crossing based circuit. The method includes setting an input to a comparator in a comparator based/zero crossing based circuit to a first known voltage, storing an output signal generated by the comparator based/zero crossing based circuit as a system offset, operating the comparator based/zero crossing based circuit by coupling input voltages to the comparator based/zero crossing based circuit to generate an output signal, and subtracting the stored system offset from the generated output signal to provide a final output signal for the comparator based/zero crossing based circuit.

BRIEF DESCRIPTION OF THE DRAWINGS

The foregoing aspects and other features of a method and system that enable compensation of offset errors and non-linearity errors in a comparator based/zero crossing based switched capacitor circuit are explained in the following description, taken in connection with the accompanying drawings.

DETAILED DESCRIPTION

Figure 1:
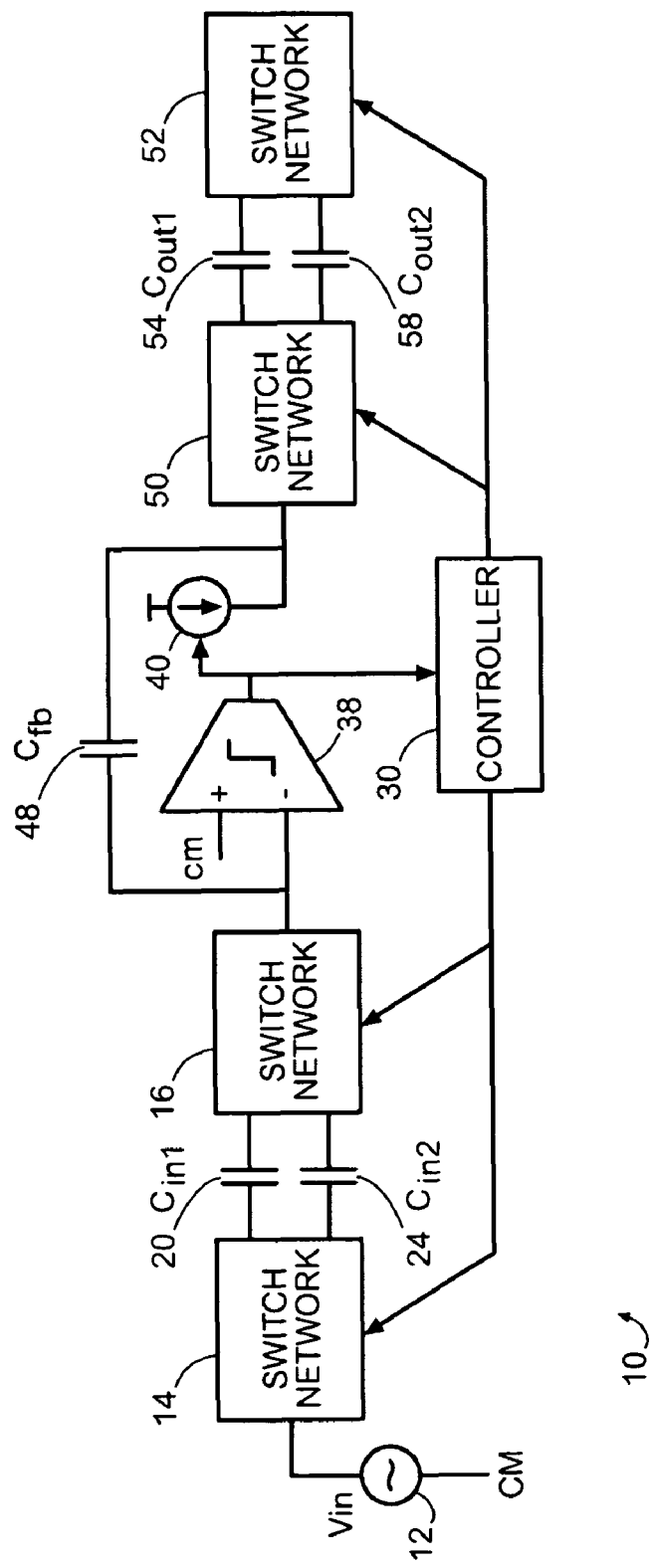
FIG. 1 is a schematic diagram of a comparator based/zero crossing based switched capacitor circuit that performs correlated double sampling to cancel errors from the output signal of the circuit.

A circuit 10 that enables a comparator based/zero crossing based switched capacitor circuit to generate an output signal in a manner that cancels errors in the output signal is shown in FIG. 1. The circuit 10 includes a switching circuit 14 and a switching circuit 16. The input signal source 12 is coupled to the switching network 14, which is coupled to the switching network 16 through the signal capacitors 20 and 24. The switching circuit 16 is coupled to a first input of a comparator 38. The comparator 38 generates a control signal on its output that is provided to a controlled current source 40. The control signal turns the controlled current source 40 on and off to charge one of the output capacitors 54 and 58. The output capacitors 54 and 58 are coupled to the switching networks 50 and 52. All of the switching circuits 14, 16, 50, and 52 are coupled to the controller 30 to receive control signals. The operation of the switching circuits is explained below with reference to FIG. 2. The switching networks are controlled to provide two paths at the input stage and the output stage. One path provides a positive gain and the other provides a negative gain. The two gains are equal, but have opposite polarities. A feedback capacitor 48 is coupled between the output of the comparator 38 and the inverting input of the comparator for feedback control.

Figure 2:
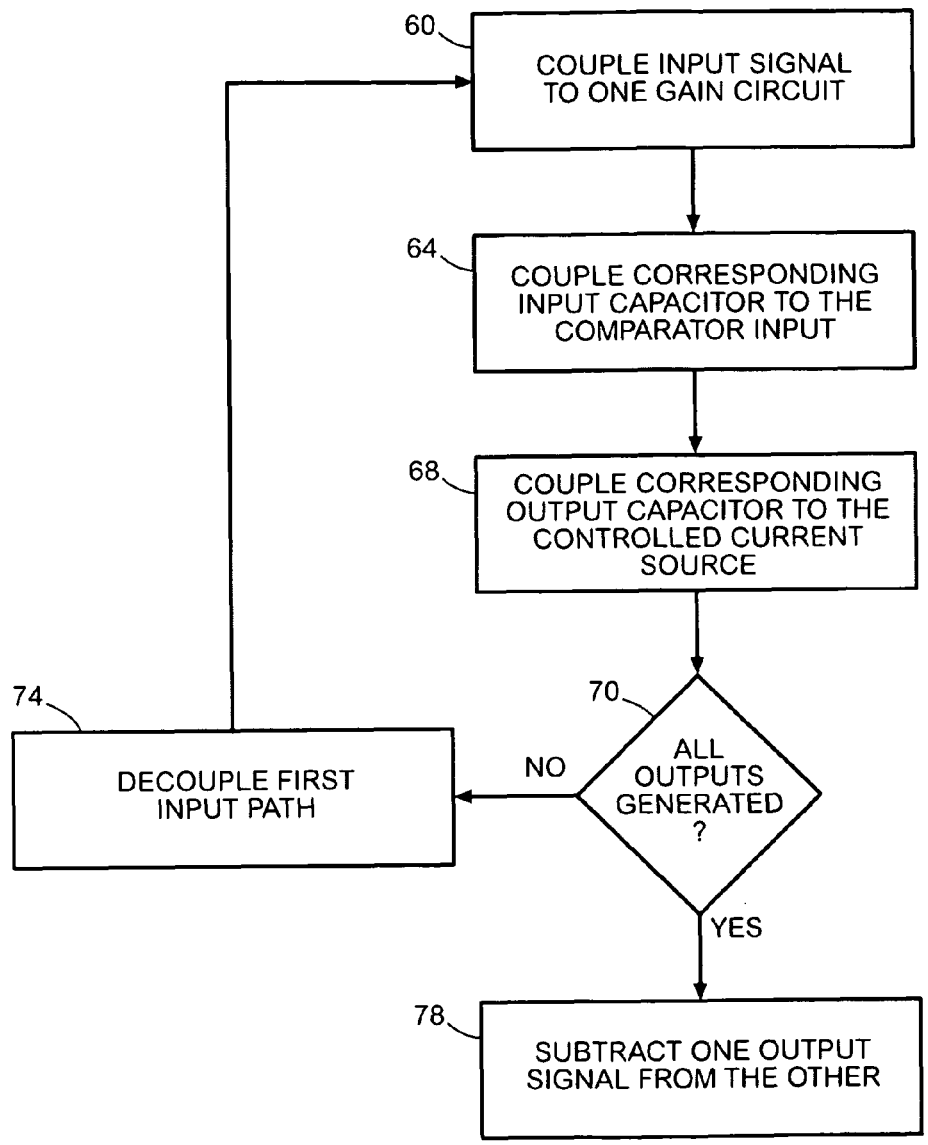
FIG. 2 is a flow diagram of a process for operating a comparator based/zero crossing based circuit with correlated double sampling on the input stage to generate an output signal from which errors introduced by non-linearities in the circuit have been cancelled.
Figure 3:
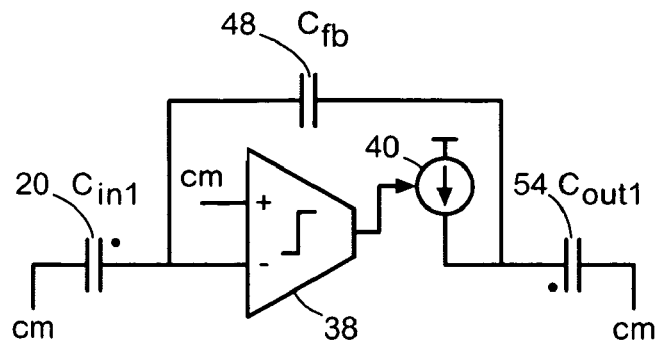
FIG. 3 is a schematic diagram of one phase of a comparator based/zero crossing based switched capacitor circuit (switches not shown for clarity) in which one of the input capacitors in FIG. 1 is coupled to an input of the comparator of the circuit and a corresponding output capacitor has been coupled to the controlled current source.
Figure 4:
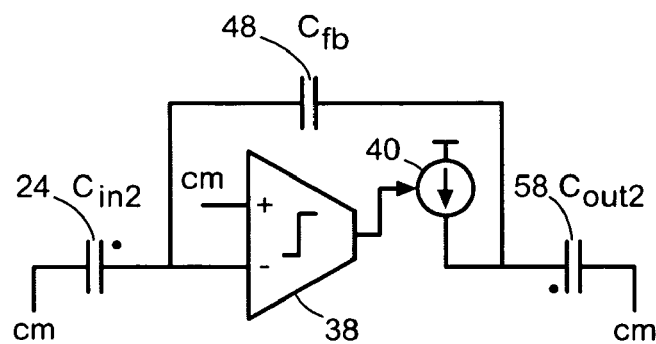
FIG. 4 is a schematic diagram of one phase of a comparator based/zero crossing based circuit (switches not shown for clarity) in which the other capacitor of the input capacitors in FIG. 1 is coupled to an input of the comparator of the circuit and a corresponding output capacitor has been couple to the controlled current source.

A flow diagram presenting a generic control scheme for the circuit 10 of FIG. 1 is shown in FIG. 2. The process begins by coupling a switching circuit to one of the input capacitors (block 60), the selected input capacitor to the comparator (block 64), and the output of the controlled current source to the corresponding output capacitor (block 68). For example, the input signal may be first coupled to the input of the comparator through one path through the switching circuit 14, input capacitor 20, and the switching circuit 16. This path enables the comparator 38 and controlled current source 40 to generate an output signal from the input signal. This output is delivered via the switching circuits 50 and 52 to the output capacitor 54 for storage. This circuit operation is depicted schematically in FIG. 3. Once the first output signal is generated from the input signal, the process determines whether all output signals have been generated (block 70). If only one output signal has been generated, the first input path is decoupled (block 74) and the process is repeated for the other path through the capacitors, input switching circuits, and output switching circuits (blocks 60-68). In the case being discussed, the first input path provided through switching circuits 14, 16, 50, and 52 would be decoupled from the capacitors 20 and 54 and the input signal 12 would be coupled to the capacitor 24 by another path through the switching circuits 14 and 16 and then to the input of the comparator 38. The output of the current source 40 would be coupled to the output capacitor 58 through another path through switching circuits 50 and 52. This circuit operation is depicted schematically in FIG. 4. The first path produces a negative version of the input signal that was used to generate the first output signal that is stored in capacitor 54. Thus, the output signal stored in the capacitor 58 is the operation of the circuit transfer function on an input signal of the opposite polarity. As discussed below with reference to the Taylor series that may be used to represent this transfer function, one output signal can be subtracted from the other output signal to generate the final output signal for the circuit 10. In the process of FIG. 2, this subtraction (block 78) is performed by controlling the switching circuits 50 and 52 so they couple the two output capacitors together to generate a final output signal corresponding to such a subtraction.

Figure 5:
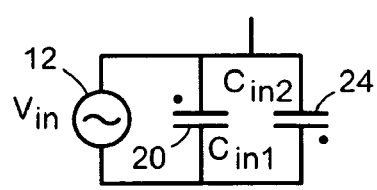
FIG. 5 is a schematic diagram of one version of an input stage (switches not shown for clarity) that may be used to sample the input signal in a different polarity in FIG. 1.
Figure 6:
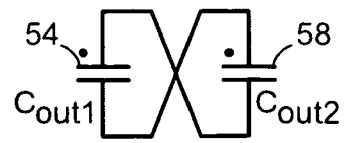
FIG. 6 is a schematic diagram of the two output capacitors of the comparator based/zero crossing based circuit (switches not shown for clarity) being coupled to one another to subtract the two output signals and cancel errors in the final output signal of the circuit.

One example of an input sampling stage that may be used to implement the switching circuit 14 and the switching circuit 16 is shown in FIG. 5. In this circuit, the input capacitors 20 and 24 are configured with opposite polarities to store a positive version of the input signal in one capacitor and a negative version of the input signal in the other capacitor. Other input sampling circuits may be used to achieve the two input signals that are the same except for their polarities. Similarly, the controller may be used to couple the two output capacitors to one another as shown in FIG. 6 to subtract one output signal from the other output signal. This output signal corresponds to the second Taylor series transfer function described below. This subtraction enables the errors in the two output signals to be subtracted from one another and the final output signal provides a more linearly responsive signal.

The controller that generates the control signals for the switching circuits 14, 16, 50, and 52 may be implemented with a processor executing stored programmed instructions or it may be implemented with discrete logic components or both. For example, the controller 30 may be a digital signal processor (DSP) executing a program or it may be an application specific integrated circuit (ASIC). Regardless of implementation, the controller 30 generates control signals provided to the switching circuits to enable and disable switches selectively. The switches may be transistors, such as field effect transistors or bipolar transistors. These switches are activated and deactivated to synchronize the coupling of one input capacitor and one output capacitor to the comparator based/zero crossing based switched capacitor circuit to generate an output signal from the input signal at one polarity. The switches are then operated to decouple the first used input and output capacitors from the circuit and to couple the other input and output capacitors to the circuit to generate an output signal from the input having the opposite polarity. One of the output signals is subtracted from the other input signal to generate the final output signal. The explanation for operating the circuit with this type of correlated double sampling may be made with reference to the Taylor series for the transfer function of the circuit.

The transfer function of a comparator based/zero crossing based switched capacitor circuit may be described with a Taylor series having the form:

$$f(x) = a_0 + a_1 \cdot x + a_2 \cdot x^2 + a_3 \cdot x^3 + a_4 \cdot x^4 + a_5 \cdot x^5 + K$$

The input signal is provided to the input of the comparator in a correlated double sample manner by the controller 30 generating control signals to the switches in the switching circuits 14, and 16. The input capacitors 20 and 24 are configured to store the input signal with opposite polarities. In the correlated double sampling input, one of the capacitors is coupled to the comparator 38 while the other input capacitor is not coupled and then the one input capacitor is decoupled from the comparator and the other input capacitor is coupled to the comparator. Consequently, the transfer function for the circuit is f(x) with one input and f(−x) with the other input. Adding these two results together and dividing by two yields:

$$f_{out}(x) = \frac{f(x) - f(-x)}{2}$$

Which may be expressed as a Taylor series in the form:

$$f_{out}(x) = a_1 \cdot x + a_3 \cdot x^3 + a_5 \cdot x^5 + K$$

This overall transfer function indicates the even exponential terms are canceled as well as the $a_0$ term. Because the offset of the comparator and the offset of the circuit influence the $a_0$ term, elimination of this term attenuates these offset errors as well. This circuit design makes the nonlinearities of the circuit symmetrical to the common mode of the circuit so these errors can be canceled from the output signals by the subtraction.

Figure 7:
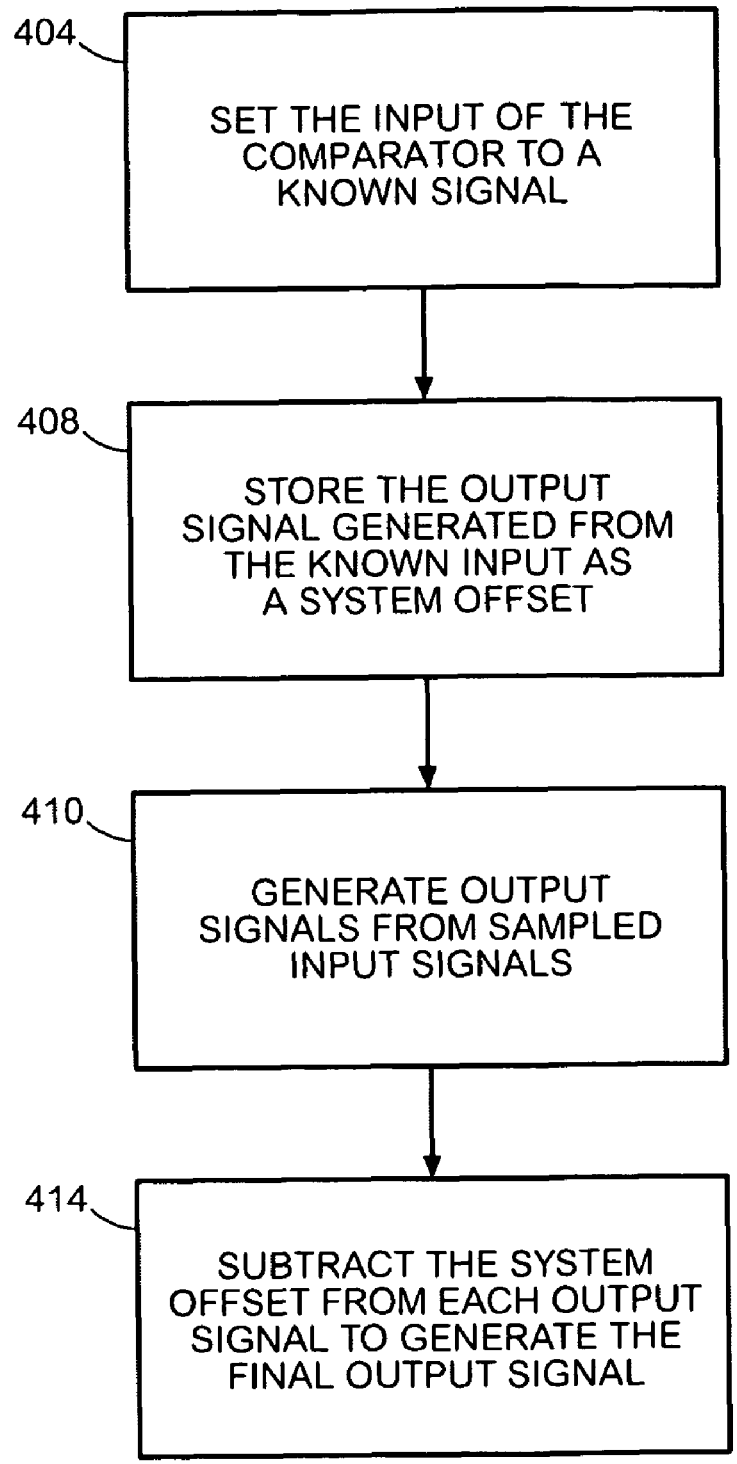
FIG. 7 is a flow diagram of another process for measuring offset error in a comparator based/zero crossing switched capacitor circuit, which is used to adjust the output signal during operation of the circuit.
Figure 8:
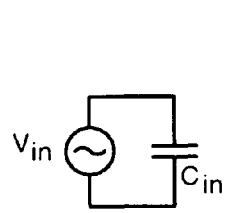
FIG. 8 is a schematic diagram of a sampling phase for a switched capacitor circuit (switches not shown for clarity).
Figure 9:
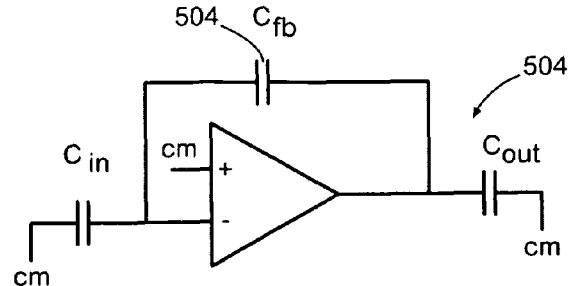
FIG. 9 is a schematic diagram of one phase of a switched capacitor circuit (switches not shown for clarity).
Figure 10:
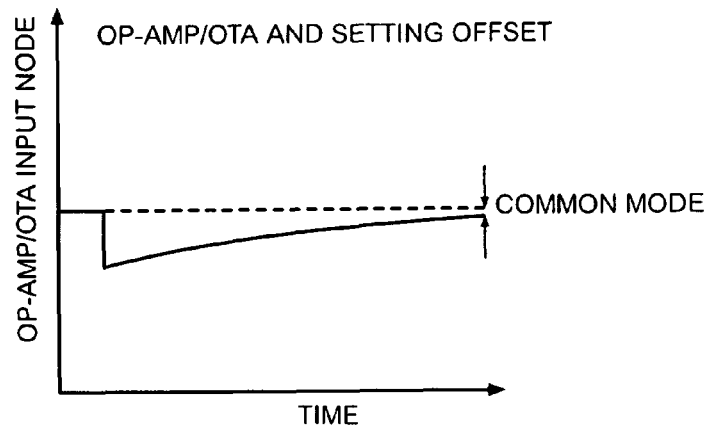
FIG. 10 is a graph of an input signal to the sampling stage of FIG. 8.
Figure 11:
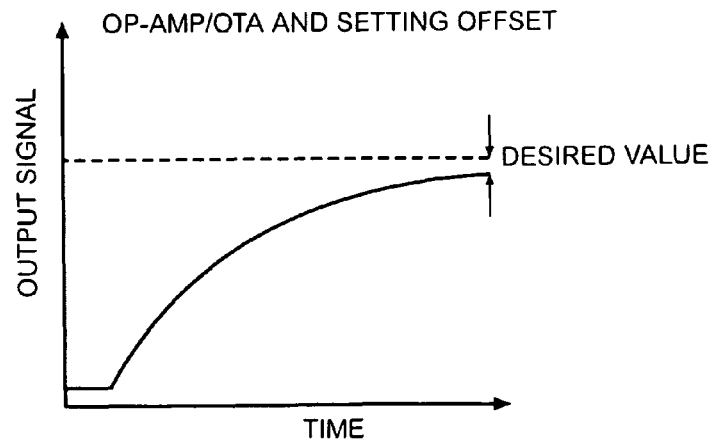
FIG. 11 is a graph of an output signal from the switched capacitor circuit of FIG. 9.
Figure 12:
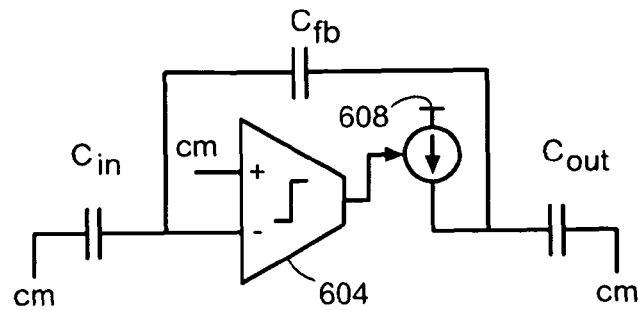
FIG. 12 is a schematic diagram of a comparator based/zero crossing based switched capacitor circuit (switches not shown for clarity).
Figure 13:
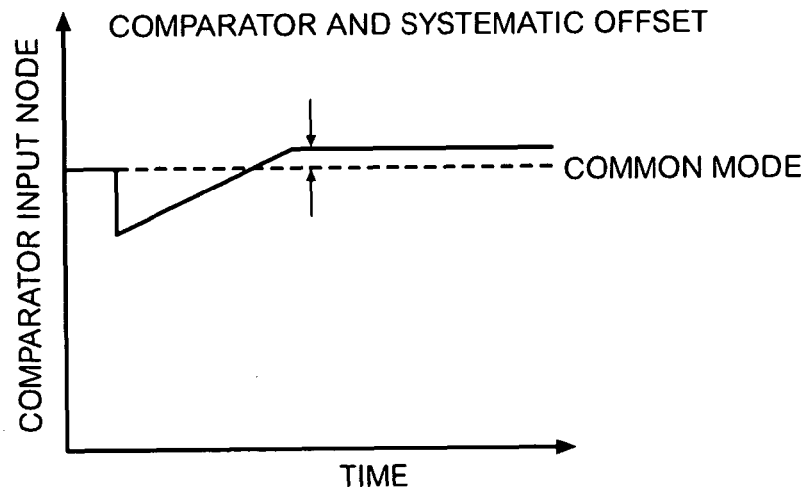
FIG. 13 is a graph of an input signal to the sampling stage of the comparator based/zero crossing capacitor circuit of FIG. 12.
Figure 14:
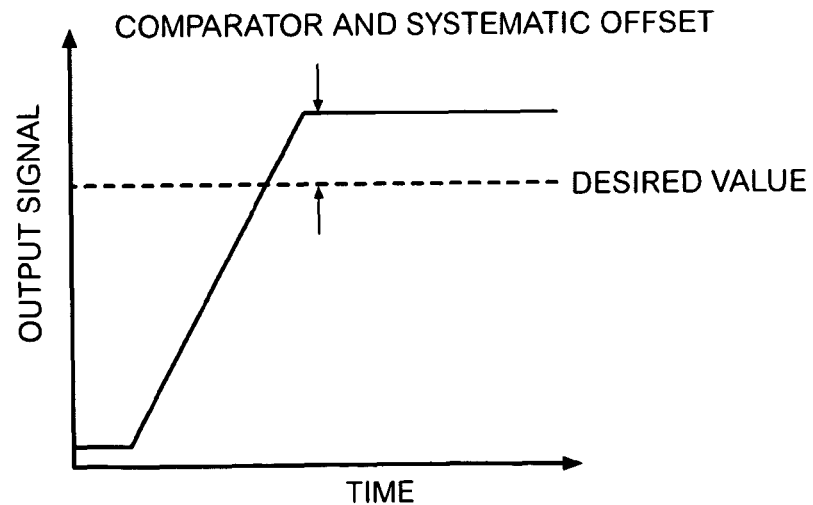
FIG. 14 is a graph of an output signal from the comparator based/zero crossing based switched capacitor circuit of FIG. 12.

In another embodiment, a comparator based/zero crossing switched capacitor circuit is operated in accordance with an offset canceling process, such as the process 400 shown in FIG. 7. During a calibration procedure, an input to a comparator in a comparator based/zero crossing switched capacitor circuit is set to a first known voltage (block 404). In one embodiment, this known voltage is zero volts. The output signal generated by the comparator based/zero crossing circuit is stored as a system offset (block 408). The comparator based/zero crossing circuit is thereafter operated by coupling input voltages to the circuit to generate output signals (block 410). The stored system offset is subtracted from the generated output signals to provide final output signals for the comparator based circuit (block 414). This method addresses offset errors in the final output signal, but does not necessarily address nonlinearities that may occur in the signal.

Those skilled in the art will recognize that numerous modifications can be made to the specific implementations described above. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

We claim:

1. A method for compensating for errors in a comparator based/zero crossing based switched capacitor circuit comprising:
generating with a comparator based/zero crossing based switched capacitor circuit a first output signal from a positive polarity input signal;
generating with the comparator based/zero crossing based switched capacitor circuit a second output signal with the input signal having a negative polarity; and
subtracting the second output signal from the first output signal to generate a final output signal for the comparator based/zero crossing based switched capacitor circuit.

2. The method of claim 1 further comprising:
storing the positive polarity input signal in a first input capacitor; and
storing the negative polarity input signal in a second input capacitor.

3. The method of claim 2 further comprising:
coupling the positive polarity input signal from the first input capacitor to an input of a comparator to generate the first output signal.

4. The method of claim 3 further comprising:
storing the first output signal on a first output capacitor.

5. The method of claim 4 further comprising:
decoupling the first input capacitor from the input of the comparator; and
coupling the second input capacitor to the input of the comparator to generate the second output signal.

6. The method of claim 5 further comprising:
storing the second output signal on a second output capacitor.

7. The method of claim 6 further comprising:
coupling the first output capacitor and the second capacitor together to subtract the second output signal from the first output signal.

8. A comparator based/zero crossing based switched capacitor circuit having error cancellation comprising:
a sampling stage configured to store an input signal with opposite polarities;
a pair of input switches, each input switch having an input coupled to the sampling stage;
a comparator having a first input coupled to an output from each input switch in the pair of switches;
a controlled current source having a control input that is coupled to an output of the comparator;
a feedback capacitor that is coupled between an output of the controlled current source and the input of the comparator;
a pair of output switches, each output switch having an input coupled to the output of the controlled current source;

a pair of output capacitors, each input of the output capacitors being coupled to an output of one of the output switches and each output of the output capacitors being coupled to a second input of the comparator; and a controller to generate control signals to the input switches and the output switches, the controller being configured to generate signals to couple selectively the input switches to the input of the comparator in synchronization with the output switches being selectively coupled to the output capacitors to enable the comparator based/zero crossing based circuit to generate two output signals, one of which is stored in one output capacitor and the other is stored in the other output capacitor.

9. The circuit of claim 8 wherein the sampling stage comprises:
a negative gain switching circuit to generate the input signal with a negative polarity; and
a positive gain switching circuit to generate the input signal with a positive polarity.

10. The circuit of claim 9 wherein the negative gain switching circuit and the positive gain switching circuit comprise:
two input capacitors configured with opposite polarities to enable one of the two capacitors to deliver the input signal with the negative polarity to the comparator in response to one of the input switches coupling the one capacitor to the comparator and to enable the other of the two capacitors to deliver the input signal with the positive polarity to the comparator in response to the other of the input switches coupling the other capacitor to the comparator.

11. The circuit of claim 10 wherein the controller is configured to generate control signals to couple the output of one input capacitor to the input of the comparator in synchronization with signals that couple the output of one of the output switches to one of the output capacitors to store one output signal of the comparator based/zero crossing based circuit in the one output capacitor, and to generate control signals to couple the output of the other input capacitor to the input of the comparator in synchronization with signals that couple the output of the other of the output switches to store the other output signal of the comparator based/zero crossing based circuit in the other output capacitor.

12. The circuit of claim 11 wherein the controller is configured to generate signals to the output switches to couple the output of one output capacitor to the output of the other output capacitor to enable one output signal to be subtracted from the other output signal to generate a final output signal for the comparator based/zero crossing based switched capacitor circuit.

13. A method for compensating for errors in a comparator based/zero crossing based switched capacitor circuit comprising:
generating with a comparator based/zero crossing based switched capacitor circuit a first output signal with an input signal having a first polarity;
generating with the comparator based/zero crossing based switched capacitor circuit a second output signal with the input signal having an opposite polarity; and
subtracting the second output signal from the first output signal to generate a final output signal for the comparator based/zero crossing based switched capacitor circuit.

14. The method of claim 13 wherein the first output signal is generated from a positive polarity input signal; and
the second output signal is generated from a negative polarity input signal.

15. The method of claim 13 further comprising:
storing the input signal with one polarity in a first input capacitor; and
storing the input signal having the opposite polarity in a second input capacitor.

16. The method of claim 15 further comprising:
coupling the input signal from the first input capacitor to an input of a comparator to generate the first output signal.

17. The method of claim 16 further comprising:
storing the first output signal on a first output capacitor.

18. The method of claim 17 further comprising:
decoupling the first input capacitor from the input of the comparator; and
coupling the second input capacitor to the input of the comparator to generate the second output signal.

19. The method of claim 18 further comprising:
storing the second output signal on a second output capacitor.

20. The method of claim 19 further comprising:
coupling the first output capacitor and the second capacitor together to subtract the second output signal from the first output signal.

* * * * *